(12) United States Patent
Luo et al.

(10) Patent No.: US 6,642,797 B1
(45) Date of Patent: Nov. 4, 2003

(54) NORMALIZATION METHODS FOR AUTOMATIC REQUENCY COMPENSATION IN BLUETOOTH APPLICATIONS

(75) Inventors: Wenzhe Luo, Allentown, PA (US); Zhigang Ma, Allentown, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/131,212

(22) Filed: Apr. 25, 2002

(51) Int. Cl.$^7$ .................................. H03L 7/00
(52) U.S. Cl. ................. 331/1 R; 329/300; 375/324; 455/316
(58) Field of Search .................... 331/1 R; 329/300, 329/301, 302, 303; 375/317, 324, 326, 340, 334, 335, 336, 337; 455/316, 334, 265, 258, 255

(56) References Cited

U.S. PATENT DOCUMENTS

| | | | |
|---|---|---|---|
| 5,970,053 A | * 10/1999 | Schick et al. | 370/252 |
| 6,160,449 A | * 12/2000 | Klomsdorf et al. | 330/149 |
| 6,512,803 B2 | * 1/2003 | Heinzl et al. | 375/350 |

\* cited by examiner

*Primary Examiner*—Henry Choe
(74) *Attorney, Agent, or Firm*—William H. Bollman

(57) ABSTRACT

An improved automatic frequency compensation (AFC) technique and apparatus is provided for piconet applications, e.g., BLUETOOTH™ applications. In particular, the present invention provides an offset normalizer which normalizes frequency offset against maximum deviations. By normalizing the frequency offset, before determination of an adjustment of a local oscillator, the local oscillator adjustment becomes uncorrelated with respect to gain along the receiving path (including in a demodulator). Thus, extremely precise adjustments can be made to the local oscillator in a piconet device to provide extremely precise automatic frequency compensation.

16 Claims, 5 Drawing Sheets

BLOCK DIAGRAM OF NEW AFC BASED ON OFFSET NORMALIZER

BLOCK DIAGRAM OF NEW AFC BASED ON OFFSET NORMALIZER

CONVENTIONAL AFC MECHANISM

NORMALIZATION METHODS FOR AUTOMATIC REQUENCY COMPENSATION IN BLUETOOTH APPLICATIONS

BACKGROUND OF THE INVENTION

1. Field of the Invention

The present invention relates to piconet wireless networks. More particularly, it relates to frequency offset compensation between piconet devices such as BLUETOOTH™ conforming wireless piconet devices.

2. Background of Related Art

Piconets, or small wireless networks, are being formed by more and more devices in many homes and offices. In particular, a popular piconet standard is commonly referred to as a BLUETOOTH piconet. Piconet technology in general, and BLUETOOTH technology in particular, provides peer-to-peer communications over short distances.

The wireless frequency of piconets may be 2.4 GHz as per BLUETOOTH standards, and/or typically have a 20 to 100 foot range. The piconet RF transmitter may operate in common frequencies which do not necessarily require a license from the regulating government authorities, e.g., the Federal Communications Commission (FCC) in the United States. Alternatively, the wireless communication can be accomplished with infrared (IR) transmitters and receivers, but this is less preferable because of the directional and visual problems often associated with IR systems.

A plurality of piconet networks may be interconnected through a scatternet connection, in accordance with BLUETOOTH protocols. BLUETOOTH network technology may be utilized to implement a wireless piconet network connection (including scatternet). The BLUETOOTH standard for wireless piconet networks is well known, and is available from many sources, e.g., from the web site www.bluetooth.com.

The BLUETOOTH specification allows for up to +/−75 kHz of initial frequency offset for a transmitter at the start of a burst. If one assumes that both transmitter and receiver have the same tolerance, then this would imply that up to +/−150 kHz offset may exist between a transmitter of a first wireless piconet device and a receiver of another wireless piconet device at the beginning of any given packet. Furthermore, since from a master's perspective consecutive slot packets coming from different slaves have no relationship to each other in terms of frequency offset, they too could be as much as 150 kHz different. This is a fairly significant offset considering that the minimum FSK tone deviation is only 115 kHz.

BLUETOOTH devices typically require a receiver in any given BLUETOOTH device to perform a frequency offset correction during the preamble of each and every packet. However, this requirement poses a challenge because there are only five (5) bits of preamble 10101 used to train. the receiver before the sync word needs to be demodulated and recognized.

According to the BLUETOOTH specification, BLUETOOTH systems typically operate in a range of 2400 to 2483.5 MHz, with multiple RF channels. For instance, in the US, 79 RF channels are defined as f=2402+k MHz, k=0, ..., 78. This corresponds to 1 MHz channel spacing, with a lower guard band (e.g., 2 MHz) and an upper guard band (e.g., 3.5 MHz).

To receive a radio frequency (RF) signal from another piconet device, the receiving device must lock onto the transmitted frequency. Moreover, all receiving devices have a local oscillation usually provided by a local oscillator (LO), from which all local frequencies in the received device are derived.

In an ideal world, all piconet devices would have exactly the same local oscillation, and thus all derived frequencies in all devices would be exactly identical. Unfortunately, the real world is far from this ideal. Rather, local oscillations vary, or have an offset, due to, e.g., temperature differences, device differences, local oscillator differences. Moreover, the received signal may be interfered with in transmission and may, in fact, be varied from the exact ideal RF carrier frequency.

Automatic frequency compensation (AFC) is employed in piconet devices (e.g., in BLUETOOTH device) to compensate for variances in local oscillations and align the local oscillator to the frequency of the received RF signal. Automatic frequency compensation (AFC) is particularly important in the design of piconet RF transceivers.

BLUETOOTH RF signals are modulated, using Gaussian Frequency Shift Keyed (GFSK) modulation, with the binary 1's and 0's being distinguished by the direction of deviations in the frequency from a center frequency. In BLUETOOTH devices, the maximum deviations are +150 KHz and −150 KHz, under ideal conditions.

FIG. 3 shows the conventional reception of an ideal RF signal having 1's and 0's represented by frequency deviations $F_{-(ideal)}$, $F_{+(ideal)}$ as expected, e.g., +/−150 KHz about a center frequency $F_c$.

When there is an offset between a received RF signal and a local oscillator, the offset becomes added to the deviations in the received RF signal, causing difficulties in correct demodulation thereof.

FIG. 4 shows the conventional reception of an ideal RF signal having 1's and 0's represented by frequency deviations $F_{-(actual)}$, $F_{+(actual)}$ which are moved in frequency (i.e., offset) from the expected locations +/−150 KHz about the expected center frequency $F_c$, respectively.

In particular, as can be seen in FIG. 4, this causes a greatly reduced signal in the expected locations +/−150 KHz about the center frequency $F_c$, significantly raising the number of errors in the detection of the received signal.

To reduce the number of errors, the local oscillator of BLUETOOTH devices employ automatic frequency control to adjust the local oscillations commensurate with an expected offset between the received RF signal and the local oscillations. Thus, AFC reduces the offset between the received RF signal and the local oscillator.

As can be imagined, detection of the frequency offset is the difficult part of automatic frequency control. FIG. 5 shows a conventional technique for providing automatic frequency control in the analog domain to adjust for a frequency offset between a received RF signal and a local oscillator.

In particular, as shown in FIG. 5, the conventional AFC technique utilizes a series connection of a demodulator 202, an analog peak detector 204, a midpoint determiner 206, a register 208 and control logic 210 to provide a control signal to a local oscillator of the receiving device.

The demodulator 202 (e.g., a GFSK demodulator) demodulates an RF frequency signal $S_f(t)$ to produce an analog amplitude received signal $S_a(t)$.

The analog peak detector 204 detects peaks in the amplitude signal $S_a(t)$ using a peak detection method. In particular, the analog peak detector 204 determines the positive and negative peaks in the amplitude signal $S_a(t)$ as the maximum positive deviation ($V_+$) and the maximum negative deviation ($V_-$), respectively.

The mid point detector 206 determines the mid point $V_m$ between the maximum positive deviation $V_+$ and the maximum negative deviation $V_-$ using the simple algorithm $V_m=(V_++V_-)/2$. The mid point Vm is presumed to be, ideally, the center frequency $F_c$ of the received signal. Any difference between the mid point $V_m$ and the expected center frequency $F_c$ of the received RF signal is presumed to be equal to the frequency offset.

To this end, a register 208 provides data to control logic 210, which compares the mid point $V_m$ to predetermined threshold values to estimate the frequency offset $F_o$, which is used to make a corresponding adjustment to a local oscillator to align the frequency of the local oscillator with that of the received RF signal.

The assumption in this conventional technique, however, is that:

$$S_a(t)=K_0*F[S_f(t)]$$

wherein $F[S_f(t)]$ denotes the instant frequency of the received RF signal $S_f(t)$, and $K_o$ should be a constant. This proves to be good for detection, e.g., 1000 mV/150 KHz.

However, in reality, for mdst demodulator implementations, $K_o$ is not purely a constant, but rather depends on $|S_f(t)|$ and the gain $K_d$ of the demodulator 202. Dependence on $|S_f(t)|$ can be greatly relieved by the use of automatic gain control (AGC), but not completely. Moreover, dependence on the gain $K_d$ of the demodulator 202 will see the $K_0$ variation window because of the process fluctuation.

The consequence is that the same mid point $V_m$ (as shown in FIG. 2) does not reflect the same "frequency offset" for different values of $K_o$. Therefore, adjustment to the local oscillator is not entirely accurate based on a typical $K_o$. In some cases, if the $K_o$ variation is very large, automatic frequency control may not work properly at all.

There is a need for an improved apparatus and technique for compensating for frequency offsets as between piconet devices (e.g., BLUETOOTH piconet devices) in a more accurate manner.

SUMMARY OF THE INVENTION

In accordance with the principles of the present invention, an automatic frequency compensation circuit for a local oscillator comprises an analog-to-digital converter to digitize a demodulated signal. A digital peak detector determines a maximum positive peak in the demodulated signal and a maximum negative peak in the demodulated signal. An offset normalizer normalizes the maximum positive peak and the maximum negative peak, and provides a signal to control a local oscillator in correspondence with a determined frequency offset, whereby frequency offset control of the local oscillator is attained without sensitivity to variable receive gains.

In accordance with another aspect of the present invention, a method for controlling a local oscillator comprises demodulating a received RF signal, and determining a maximum positive peak value and a maximum negative peak value in the received RF signal. The maximum positive peak value and the maximum negative peak value are correlated with a particular normalized frequency offset, and a local oscillator is controlled based on the correlation.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides improved automatic frequency compensation (AFC) in piconet applications, e.g., in BLUETOOTH™ applications. In particular, the present invention provides an offset normalizer which normalizes frequency offset against maximum deviations. By normalizing the frequency offset, before determination of an adjustment of a local oscillator, the local oscillator adjustment becomes uncorrelated with respect to gain along the receiving path (including in a demodulator). Thus, extremely precise adjustments can be made to the local oscillator in a piconet device to provide extremely precise automatic frequency compensation.

Figure 1:
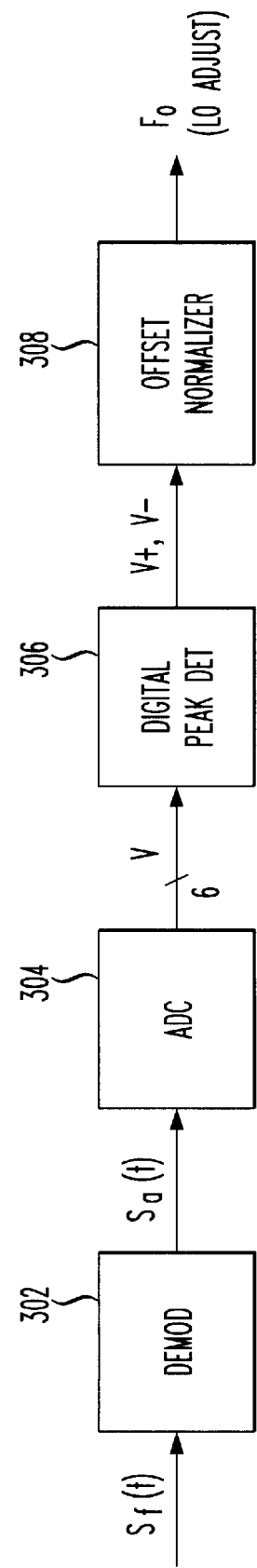
FIG. 1 shows an automatic frequency compensation (AFC) implementation for piconet devices using an offset normalizer, in accordance with the principles of the present invention.

FIG. 1 shows an automatic frequency compensation (AFC) implementation for piconet devices using an offset normalizer, in accordance with the principles of the present invention.

In particular, as shown in. FIG. 1, the inventive automatic frequency compensation (AFC) includes a series connection of a demodulator 302, an analog-to-digital (ADC) converter 304, a digital peak detector 306, and a read only memory (ROM) 308.

The demodulator 302 demodulates a modulated signal, e.g., a GFSK modulated RF signal $S_f(t)$ (frequency modulated) into an appropriate amplitude signal $S_a(t)$ (voltage or current).

The ADC 304 in the disclosed embodiment is a 6-bit ADC. While a 6-bit ADC is disclosed, other bit-length ADCs may be chosen based on a desired precision in the AFC system.

The ADC 304 samples $S_a(t)$ at an appropriate sampling rate, and provides an output of corresponding digital samples (V[5:0]).

The digital peak detector 306 continuously monitors the output digital samples from the ADC 304, and determines a maximum peak value $V_+$ (in the disclosed 6-bit embodiment $V_+[5:0]$) and a minimum peak value $V_-$ ($V_-[5:0]$). The maximum peak values $V_+$, $V_-$ may be determined for relative signals, e.g., for a particular message burst, and reset afterwards.

The offset normalizer 308, an important element in the present invention, normalizes the input peak values $V_+$, $V_-$.

Figure 2:
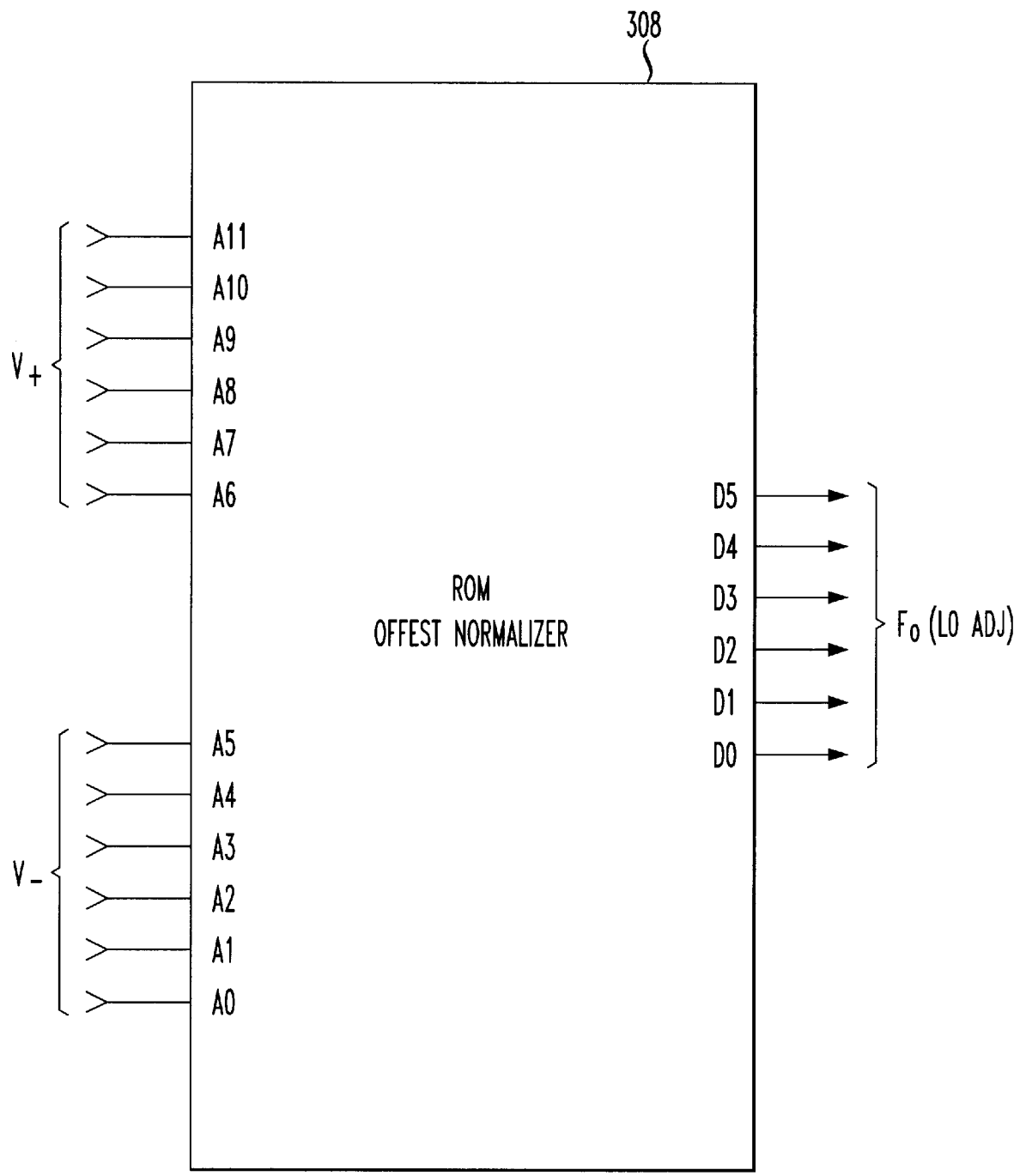
FIG. 2 shows an exemplary embodiment of the offset normalizer shown in FIG. 1, implemented as a look-up table in a read only memory (ROM), in accordance with the principles. of the present invention.
Figure 3:
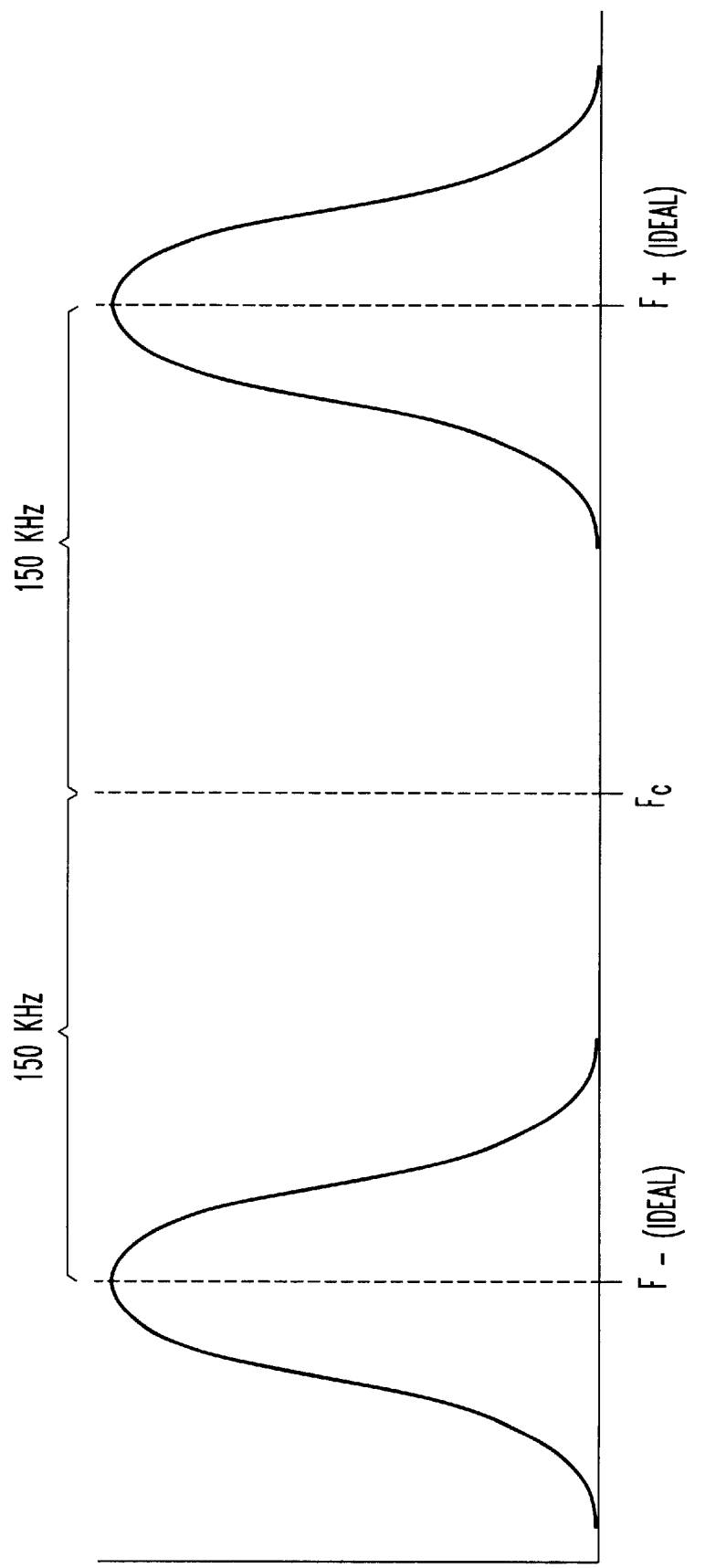
FIG. 3 shows the conventional reception of an ideal RF signal having 1's and 0's represented by frequency deviations F _(ideal), $F_{+(ideal)}$ as expected, e.g., +/−150 KHz about a center frequency $F_c$.
Figure 4:
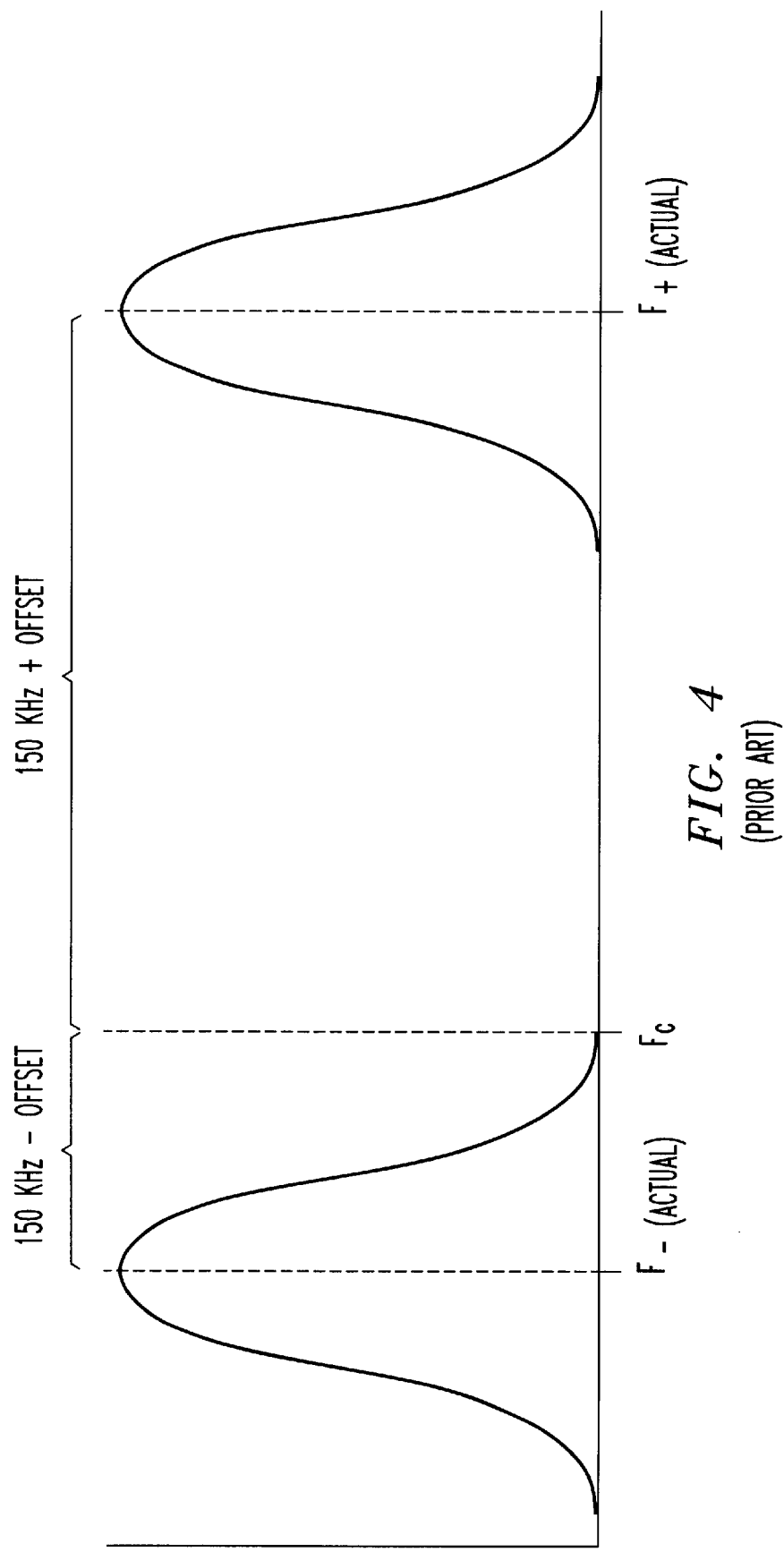
FIG. 4 shows the conventional reception of an ideal RF signal having 1's and 0's represented by frequency deviations F_(actual), $F_{+(actual)}$ which are moved in frequency (i.e., offset) from the expected locations +/−150 KHz about the expected center frequency $F_c$, respectively.
Figure 5:
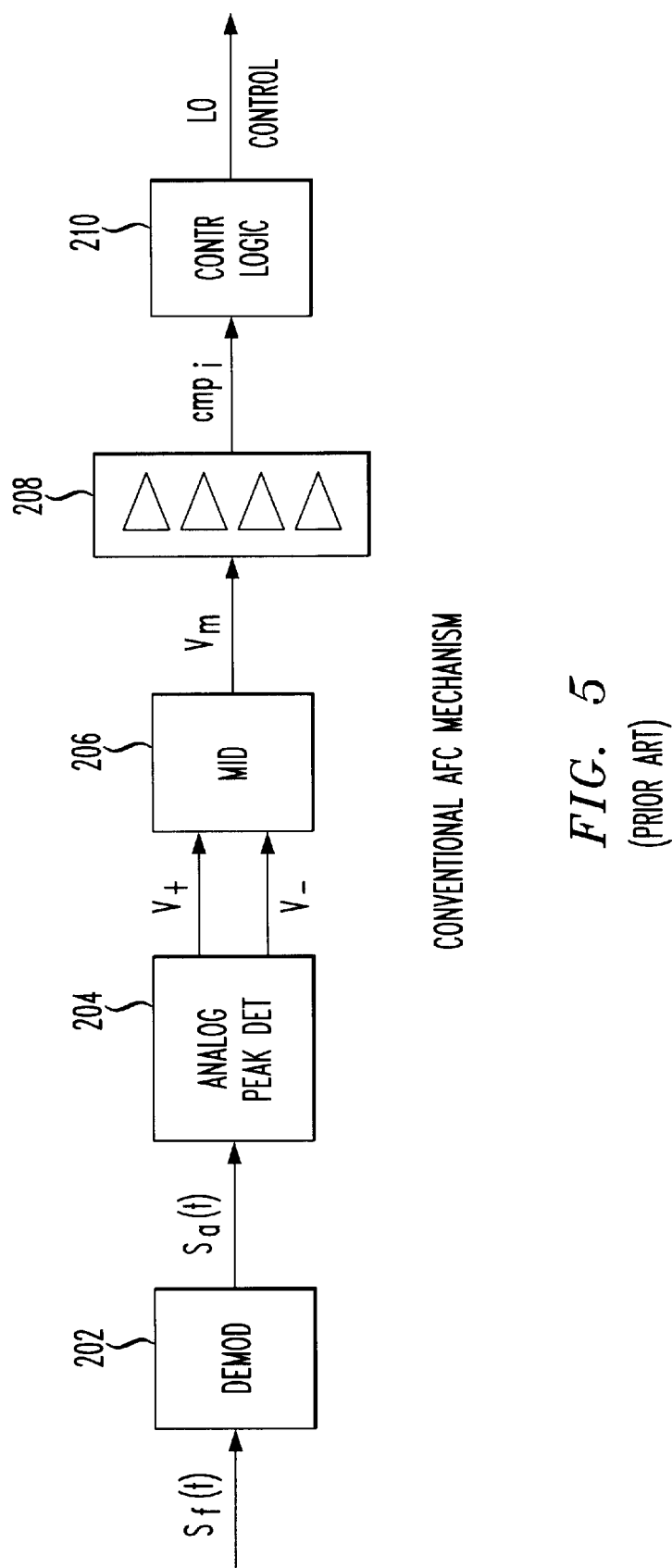
FIG. 5 shows a conventional technique for providing automatic frequency control in the analog domain to adjust for a frequency offset between a received RF signal and a local oscillator.

FIG. 2 shows an exemplary embodiment of the offset normalizer 308 shown in FIG. 1, implemented as a look-up table in a read only memory (ROM), in accordance with the principles of the present invention.

In particular, as shown in FIG. 2, a ROM of appropriate technology (e.g., CMOS, TTL, etc.) and speed for the particular application is programmed to contain a look-up table. The look-up table. stores a particular offset frequency $F_o$ value for each possible combination of $V_+[5:0]$ and $V_-[5:0]$. The look-up table may be theoretically determined, or empirically determined, depending upon, the desired accuracy and customization of the system. The look-up table provides the desired normalization.

In the given embodiment, the offset normalization look-up table stored in the ROM stores data relating to particular values of the offset frequency $F_o$ for each address A0–A11 formed by the combination of the maximum positive and negative values $V_+$, $V_-$ of the RF signal.

Depending upon the required bit-length of the ADC 304, and/or the precision of $F_o$, the size of the ROM 308 (either length and/or width) may be significantly changed.

The ROM 308 may be, e.g., a 4K×6-bit ROM, though any suitably sized (i.e., length and/or width) ROM may be used. For instance, 8-bit ROMs may be used, leaving 2-bits unused in each memory location for 6-bit ADC samples. Moreover, separate ROMs may be ganged together to provide additional length and/or width in the ROM 308.

Based on the maximum and minimum peak values $V_+$, $V_-$, respectively, determined by the digital peak detector 306, the offset normalizer 308 provides a direct output of the offset frequency $F_o$ in an amount of time corresponding to the speed of the ROM. Thus, extremely fast ROM device(s) may be used if extremely fast determination of the offset frequency is desired, which is often the case, particularly in high frequency applications.

The offset normalizer 308 outputs a digital form of the offset frequency $F_o$ to the local oscillator, allowing direct and rapid adjustment of the frequency of the local oscillator, in accordance with the principles of the present invention.

In explaining the offset normalization function of the offset normalizer 308, assume that demodulation has been performed, followed by peak detection. At the output of the peak detector, the positive/negative peaks are observed as $V_+$ or $V_-$. Assume the positive polarity, then $V_+$ represents the "maximum positive frequency deviation ($dF_+$)", which codes symbol "1"; $V_-$ represents the "maximum negative frequency deviation ($dF_-$)", which codes symbol "0".

In piconet applications, and in particular in BLUETOOTH applications, the maximum frequency deviation is 150 KHz on each side.

If there is no frequency offset, then:

$$dF_+ = dF_{+,ideal} = +150 \text{ KHz; and}$$

$$dF_- = dF_{-,ideal} = -150 \text{ KHz}$$

If there is a frequency offset $F_o$, then:

$$dF_+ = 150 \text{ KHz} + F_o; \text{ and}$$

$$dF_- = -150 \text{ KHz} + F_o$$

The normalized DC offset is calculated as:

$$V_{dc\_nmlz} = (V_+ + V_-)/[2*(V_+ - V_-)] \quad \text{EQ1}$$

And based on the normalized DC offset, the frequency offset $F_o$ is:

$$F_o = V_{dc\_nmlz} * (dF_+ - dF_-) = V_{dc\_nmlz} * 300 \text{ KHz} \quad \text{EQ2}$$

The offset normalizer 308 performs the functions of both equation EQ1 and equation EQ2. In equation EQ1, $(V_+ + V_-)/2$ is the DC offset at the demod output, which corresponds to the frequency offset $F_o$ at the input to the demodulator 302. While $(V_+ - V_{31})$ is the DC swing at the output of the demodulator 302, which corresponds to the frequency swing of the FM signal.

The normalization of equation EQ1 calibrates the DC offset against the output swing at the output of the demodulator 302. Therefore, unlike the DC offset itself, which is sensitive to the amplitude at the input to the demodulator 302 and the gain of the demodulator 302.

In accordance with the principles of the present invention, the normalized DC offset is non-sensitive to the amplitude of the peak values $V_+$ or $V_-$. Rather, the DC offset cares only about the ratio of $(V_+ + V_{31})/(V_+ - V_-)$.

Equation EQ2 shows the greatly simplified form of "normalized DC offset")to the "frequency offset")($F_o$). The rededuction to this simplified form is as follows:

$$V_+ = K(\text{amp, dmd}) * F_+ = K(\text{amp, dmd}) * (150 \text{ KHz} + F_o) \quad \text{EQ3}$$

$$V_- = K(\text{amp, dmd}) * F_- = K(\text{amp, dmd}) * (-150 \text{ KHz} + F_o) \quad \text{EQ4}$$

In equation EQ3 and equation EQ4, the K(amp) is a function of input amplitude and the type of demodulator (e.g., GFSK).

Inserting equation EQ3 and equation EQ4 into equation EQ1 results in:

$$V_{dc\_nmlz} = F_o/300 \text{ KHz}$$

thereby proving equation EQ2.

Thus, according to equation EQ1 and equation EQ2 (and the principles of the present invention), frequency offset $F_o$ control of a local oscillator is attained without sensitivity to variable receive gains.

The present invention provides an offset normalizer 308 technique and apparatus for particular use in a piconet network device accomplished in the digital domain, e.g., with a look-up ROM, though the present invention has advantages in an analog implementation. While equation EQ1 is not an easy implementation in the analog world (largely because of the division operation), it can be accomplished using operational amplifiers. Nevertheless, a digital implementation using a digital offset normalizer (comprising, e.g., a ROM) as shown and described with respect to FIGS. 1 and 2 is a more direct solution as compared to an analog solution.

Accordingly, accurate local oscillator control with precise frequency offset is accomplished. Automated frequency compensation in accordance with the principles of the present invention provides a quick and precise adjustment and control of a local oscillator in a piconet device such that the receiving device is accurately aligned in frequency with a received RF frequency signal.

The automatic frequency compensation is continuously performed in the disclosed embodiment. However, frequency offset calculations may be periodically or occasionally performed within the principles of the present invention.

While the present invention is shown and described with reference to piconet devices in general, and to BLUETOOTH devices in particular, it has equal applicability to other types of radio frequency (RF) transceivers.

While the invention has been described with reference to the exemplary preferred embodiments thereof, those skilled in the art will be able to make various modifications to the described embodiments of the invention without departing from the true spirit and scope of the invention.

What is claimed is:

1. An automatic frequency compensation circuit for a local oscillator, comprising:

an analog-to-digital converter to digitize a demodulated signal;

a digital peak detector to determine a maximum positive peak in said demodulated signal and a maximum negative peak in said demodulated signal; and an offset normalizer to normalize said maximum positive peak and said maximum negative peak, and to provide a signal to control a local oscillator in correspondence with a determined frequency offset;

whereby frequency offset control of said local oscillator is attained without sensitivity to variable receive gains.

2. The automatic frequency compensation circuit according to claim 1, wherein said offset normalizer comprises:

a ROM.

3. The automatic frequency compensation circuit according to claim 2, wherein:

said ROM includes a look-up table correlating frequency offset values with said maximum positive peak and. said maximum negative peak.

4. The automatic frequency compensation circuit according to claim 2, wherein:

said ROM includes a look-up table correlating frequency offset values with possible combinations of maximum positive. peak values and maximum negative peak values.

5. The automatic frequency compensation circuit according to claim 1, wherein:

said offset normalizer produces a signal output which has a normalized DC offset that is not sensitive to an amplitude of said maximum positive peak value or to an amplitude of said maximum negative peak value.

6. The automatic frequency compensation circuit according to claim 1, wherein:

said offset normalizer relates an output frequency offset to input maximum positive peak values $V_+$ and maximum negative peak values $V_-$ based on a ratio $(V_+ + V_-)/(V_+ - V_-)$.

7. The automatic frequency compensation circuit according to claim 1, wherein:

said automatic frequency compensation circuit is included in a piconet device.

8. The automatic frequency compensation circuit according to claim 7, wherein:

said piconet device is a BLUETOOTH conforming device.

9. A method for controlling a local oscillator, comprising:

demodulating a received RF signal;

determining a maximum positive peak value and a maximum negative peak value in said received RF signal;

correlating said maximum positive peak value and said maximum negative peak value with a particular normalized frequency offset; and controlling said local oscillator based on said correlation.

10. The method for controlling a local oscillator according to claim 9, wherein:

said peak value is a peak amplitude voltage in said received RF signal.

11. The method for controlling a local oscillator according to claim 9, wherein:

said local oscillator is controlled in a piconet device.

12. The method for controlling a local oscillator according to claim 9, wherein:

said local oscillator is controlled in a BLUETOOTH conforming device.

13. Apparatus for controlling a local oscillator, comprising:

means for demodulating a received RF signal;

means for determining a maximum positive peak value and a maximum negative peak value in said received RF signal;

means for correlating said maximum positive peak value and said maximum negative peak value with a particular normalized frequency offset; and means for controlling said local oscillator based on said correlation.

14. The apparatus for controlling a local oscillator according to claim 13, wherein:

said peak value is a peak amplitude voltage in said received RF signal.

15. The apparatus for controlling a local oscillator according to claim 13, wherein:

said local oscillator is integrated in a piconet device.

16. The apparatus for controlling a local oscillator according to claim 13, wherein:

said local oscillator is integrated in a BLUETOOTH conforming device.

* * * * *